(12) United States Patent
Aoki et al.

(10) Patent No.: US 7,884,000 B2
(45) Date of Patent: Feb. 8, 2011

(54) METHOD FOR MANUFACTURING SIMOX WAFER

(75) Inventors: Yoshiro Aoki, Tokyo (JP); Riyuusuke Kasamatsu, Tokyo (JP); Yukio Komatsu, Tokyo (JP)

(73) Assignee: Sumco Corporation, Tokyo (JP)

( * ) Notice: Subject to any disclaimer, the term of this patent is extended or adjusted under 35 U.S.C. 154(b) by 903 days.

(21) Appl. No.: 11/695,706

(22) Filed: Apr. 3, 2007

(65) Prior Publication Data

US 2007/0238269 A1 Oct. 11, 2007

(30) Foreign Application Priority Data

Apr. 5, 2006 (JP) .............................. 2006-103847

(51) Int. Cl.
*H01L 21/425* (2006.01)

(52) U.S. Cl. ....................... 438/528; 438/407; 438/423; 257/E21.563

(58) Field of Classification Search ................. 438/407, 438/480, 423, 520, 526, 528; 257/E21.563
See application file for complete search history.

(56) References Cited

U.S. PATENT DOCUMENTS

| | | | |
|---|---|---|---|
| 5,658,809 A | 8/1997 | Nakashima et al. | |
| 5,918,136 A | 6/1999 | Nakashima et al. | |
| 5,930,643 A | 7/1999 | Sadana et al. | |
| 6,259,137 B1 | 7/2001 | Sadana et al. | |
| 6,461,939 B1 | 10/2002 | Furihata et al. | |
| 6,486,037 B2 | 11/2002 | Norcott et al. | |
| 6,756,639 B2 | 6/2004 | Norcott et al. | |
| 6,794,264 B2 * | 9/2004 | Dolan et al. ................. 438/407 |
| 7,410,877 B2 * | 8/2008 | Aoki et al. ................... 438/311 |
| 7,514,343 B2 * | 4/2009 | Aoki et al. ................... 438/526 |
| 2003/0087504 A1 * | 5/2003 | Erokhin et al. ............... 438/407 |
| 2003/0194846 A1 | 10/2003 | Hovel et al. | |

(Continued)

FOREIGN PATENT DOCUMENTS

EP 1 100 127 A1 5/2001

(Continued)

OTHER PUBLICATIONS

Taiwanese Office Action dated Jul. 29, 2010 that issued with respect to a Taiwanese counterpart application, along with an English language translation thereof.

*Primary Examiner*—Matthew C Landau
*Assistant Examiner*—Joseph C Nicely
(74) *Attorney, Agent, or Firm*—Greenblum & Bernstein, P.L.C.

(57) ABSTRACT

A method for manufacturing SIMOX wafer, wherein roughness (Rms) of an SOI layer and roughness (Rms) of an interface between the SOI layer and a BOX layer can be reduced. The method includes forming a first ion-implanted layer containing highly concentrated oxygen within a wafer; forming a second ion-implanted amorphous layer; and a high temperature heat treatment, transforming the first and second ion-implanted layers into a BOX layer by holding the wafer at a temperature between 1300° C. or more and a temperature less than a silicon melting point in an atmosphere containing oxygen, wherein when a first dose amount in forming the first ion-implanted layer is set to $2\times10^{17}$ to $3\times10^{17}$ atoms/cm$^2$, the first implantation energy set to 165 to 240 keV and a second dose amount in forming the second ion-implanted layer is set to $1\times10^{14}$ to $1\times10^{16}$ atoms/cm$^2$.

2 Claims, 7 Drawing Sheets

U.S. PATENT DOCUMENTS

| | | | |
|---|---|---|---|
| 2003/0211711 A1* | 11/2003 | Seki et al. | 438/480 |
| 2004/0266129 A1* | 12/2004 | DeSouza et al. | 438/407 |
| 2005/0003626 A1* | 1/2005 | Fox et al. | 438/404 |
| 2005/0170570 A1* | 8/2005 | DeSouza et al. | 438/162 |
| 2006/0228492 A1 | 10/2006 | Aoki et al. | |
| 2007/0128838 A1* | 6/2007 | Aoki | 438/480 |
| 2007/0178680 A1* | 8/2007 | Aoki et al. | 438/526 |
| 2007/0196995 A1* | 8/2007 | Aoki et al. | 438/400 |

FOREIGN PATENT DOCUMENTS

| | | |
|---|---|---|
| JP | 7-263538 | 10/1995 |
| KR | 10-1999-0062588 | 7/1999 |

\* cited by examiner a : Ion implantation by single implatation step
b₁ : First ion implantation by double implantation steps
b₂ : Second ion implantation by double implantation steps
b : Ion implantation by double implantation steps (a)

(b)

(a)

(b)

(a)

(b)

METHOD FOR MANUFACTURING SIMOX WAFER

BACKGROUND OF THE INVENTION

1. Field of the Invention

The present invention relates to a method for manufacturing a SIMOX wafer based on a SIMOX (Separation by IMplanted OXygen) technology among methods for manufacturing an SOI (Silicon On Insulater) wafer in which a single crystal silicon layer is formed in a silicon single crystal main body via an oxide film and a SIMOX wafer obtained by use of the method.

2. Description of the Related Art

Conventionally, two methods have been known as a method for manufacturing an SOI wafer, one is a bonding method in which two wafers are bonded with each other via an oxide film, and the other is a SIMOX method in which oxygen ions ($O^+$) are implanted from a surface of the silicon wafer to form an ion-implanted layer of a single crystal containing highly concentrated oxygen in a region of a predetermined depth within the wafer, and then this wafer is subjected to a heat treatment to thereby transform the ion-implanted layer into a buried oxide film (Buried OXide: hereinafter, referred to as BOX layer.). An SOI wafer manufactured by the SIMOX method is particularly called a SIMOX wafer.

The method for manufacturing the SIMOX wafer at an initial development stage has been based on a high dose technology. This method for manufacturing the high dose SIMOX wafer is such that oxygen atoms are implanted into the silicon wafer at the rate of about $2 \times 10^{18}$ atoms/cm$^2$ with an implantation energy of about 200 keV, the BOX layer is then formed within the wafer while keeping the wafer ion-implanted (as-implanted), and then the wafer is subjected to a high temperature annealing treatment. By this annealing treatment, a crystal defect generated in the SOI layer can be recovered, and the BOX layer can be transformed.

The SIMOX wafer obtained by this high dose technology, however, has a high dose amount of oxygen ions, so that there have been problems that many threading dislocations occur in the SOI layer, a long ion implantation time is required to thereby reduce manufacturing efficiency. This threading dislocation leads to a leakage current and deterioration in a heterointerface when a device is manufactured, so that there is a possibility of preventing improvement in device performance and performance of functionality.

For that reason, in order to achieve a reduction in threading dislocation generated in the SOI layer and a shortening of the ion implantation time, a low dose implantation technology has been developed. A method for manufacturing this low dose SIMOX wafer is such that oxygen atoms are implanted from a surface of the silicon wafer at the rate of about $3.5 \times 10^{17}$ to $4.5 \times 10^{17}$ atoms/cm$^2$ with an implantation energy of about 180 keV, and then the BOX layer is formed continuously in a plane direction parallel to the surface of the silicon wafer by performing a high temperature heat treatment. In a case where implantation energy is 180 keV, it is possible to form the BOX layer continuously in the plane direction parallel to the wafer surface only when the dose amount is $3.5 \times 10^{17}$ to $4.5 \times 10^{17}$ atoms/cm$^2$. A range of a width of this dose amount is called a dose window. The SIMOX wafer obtained by this low dose implantation technology can reduce a threading dislocation density in the SOI layer, and can improve manufacturing efficiency due to the shortening of the ion implantation time.

However, since the SIMOX wafer obtained by use of this low dose implantation technology has a small oxygen ion dose amount, a film thickness of the BOX layer becomes thin, thereby there has been a problem in reliability of the BOX layer. In addition, when the film thickness of the formed BOX layer is thin, if a particle adheres to a surface of the silicon wafer during the ion implantation, this particle serves as a mask, so that an unimplantable portion is easily generated in the ion-implanted layer formed within the silicon wafer. While the ion-implanted layer turns into the BOX layer by annealing treatment, the unimplantable portion becomes a pinhole that is one kind of crystal defect of the BOX layer, thus degrading electrical insulation characteristics. There has been a problem that the percentage of this pinhole density is higher than that of a high dose SIMOX wafer, or the like.

Therefore, in order to inhibit the pinhole generation in the BOX layer, there is proposed a method for manufacturing an SOI substrate called an ITOX (Internal Thermal OXidation) technology, in which the ion implanted silicon wafer is subjected to annealing treatment, and then it is further subjected to an oxidizing treatment in a high temperature oxygen atmosphere, and an SOI substrate manufactured by the method (See Japanese Unexamined Patent Application Publication No. H07-263538 (claim 1, claim 6, paragraph [0009], [0010], [0025], [0026], FIG. 1)).

According to the method disclosed in Japanese Unexamined Patent Application Publication No. H07-263538, first, oxygen ions are implanted from the surface of the silicon wafer at the rate of about $4 \times 10^{17}$ atoms/cm$^2$ with the implantation energy of about 180 keV. Next, the wafer in which the ion-implanted layer is formed is subjected to annealing treatment in an inert gas atmosphere containing oxygen of less than 1% concentration to transform the ion-implanted layer into the BOX layer, and then this wafer is further subjected to a high-temperature oxidizing treatment in an atmosphere containing highly concentrated oxygen more than 1% concentration. When the wafer is subjected to the high-temperature oxidizing treatment, highly concentrated oxygen in the atmosphere enters the wafer from front and rear surfaces of the wafer to be diffused therein. When this oxygen stays in a boundary surface of the BOX layer as $SiO_2$ to be stacked, the BOX layer grows, thus allowing an increase in film thickness of the BOX layer. In an SIMOX wafer obtained by this ITOX technology, when $SiO_2$ is stacked in the interface portion of the BOX layer, the pinholes generated in the BOX layer are remedied, resulting in a reduction in the pinhole density. Furthermore, roughness of an interface between the BOX layer and the silicon wafer can also be improved. As a result, electrical characteristics of the device can be homogenized.

Even in the manufacturing method based on this ITOX technology, however, since an oxygen ion dose amount is as large as $4 \times 10^{17}$ atoms/cm$^2$, it takes a long time to implant the ions and the high-temperature oxidizing treatment is also needed in addition to the annealing treatment, so that there have been problems that manufacturing efficiency is low and productivity is decreased.

Thus, in order to shorten the ion implantation time, there has been proposed a method for manufacturing the SOI wafer called a MLD (Modified Low Dose) technology where oxidizing treatment is applied to a wafer having two-implanted layers including an amorphous layer formed therein (See U.S. Patent Publication No. 5930643 (claim 1, specification page 1, right second column 5th to 43rd lines, and FIG. 1(a))).

The method disclosed in U.S. Patent Publication No. 5930643 is such that the ion implantation process is divided into two steps, and oxygen ions are implanted into the wafer at different temperatures for respective steps, so that two ion-implanted layers, namely, a single crystal layer containing highly concentrated oxygen and an amorphous layer having different crystal states are formed within the wafer, and then this wafer is subjected to a high-temperature oxidizing treatment in a mixed gas atmosphere.

Specifically, firstly, in a state where the silicon wafer is heated, oxygen ions are implanted at the rate of $2\times10^{17}$ atoms/$cm^2$ with the implantation energy of 185 keV to form a first ion-implanted layer containing highly concentrated oxygen within the wafer. Next, in a state where this wafer is cooled, oxygen ions are implanted at the rate of $3\times10^{14}$ atoms/$cm^2$ with the implantation energy of 185 keV to form a second ion-implanted amorphous layer continuously to a plane on a wafer surface side of the first ion-implanted layer. A lower portion of the second ion-implanted layer overlaps with an upper portion of the first ion-implanted layer containing highly concentrated oxygen, so that highly concentrated oxygen is contained within the second ion-implanted amorphous layer. This wafer is further heated in an inert atmosphere, such as argon containing 0.5 to 5% oxygen, and then it is held at a high temperature in a 5 to 100% oxygen atmosphere containing argon or the like. The first ion-implanted layer turns into the BOX layer by holding the wafer at the high temperature in this atmosphere containing oxygen.

Meanwhile, since the second ion-implanted layer contains highly concentrated oxygen within the ion-implanted amorphous layer, re-crystallization does not proceed smoothly during the temperature rise, resulting in a high-density defect layer including a polycrystal, a twin crystal, or a stacking fault. Since a region having this defect layer formed has a property that oxygen easily precipitates therein, oxygen in the atmosphere containing oxygen enters the wafer from front and rear surfaces of the wafer to diffuse within the wafer during holding the wafer at a constant temperature after the temperature rise, and oxygen is concentrated in this high-density defect layer to be precipitated as $SiO_2$. Thus, the high-density defect layer having $SiO_2$ precipitated therein turns into the BOX layer. For this reason, a low ion dose amount of $2\times10^{17}$ atoms/$cm^2$ allows to obtain a SIMOX wafer having the BOX layer with the same thickness as that obtained when a double dose amount is implanted.

SUMMARY OF THE INVENTION

However, in the SIMOX wafer obtained by the manufacturing method described in U.S. Patent Publication Specification No. 5930643, roughness of a surface of the SOI layer and roughness of the interface between the SOI layer and the BOX layer are increased compared with a surface roughness of the silicon wafer, so that there has been a problem that a particle with a size measurable on the surface of the silicon wafer cannot be measured on the SIMOX wafer surface.

Accordingly, an object of the present invention is to provide a method for manufacturing a SIMOX wafer wherein both of a roughness Rms of a measurement area of 10 square micrometers in the surface of the SOI layer and a roughness Rms of a measurement area of 10 square micrometers in the interface between the SOI layer and the BOX layer can be reduced, and a SIMOX wafer obtained by use of the method.

The invention according to claim 1 is, as shown in FIG. 1, the improvement of a method for manufacturing a SIMOX wafer sequentially comprising the steps of: heating a silicon wafer to a temperature in the range of 200 to 600° C. and implanting oxygen ions of first dose amount with a first implantation energy from a surface of the wafer to form a first ion-implanted layer containing highly concentrated oxygen at a first depth from the surface of the wafer;

cooling down the wafer having the first ion-implanted layer formed therein to a temperature in the range of a room temperature to 200° C. which is lower than the heating temperature and implanting oxygen ions of a second dose amount with a second implantation energy from the surface of the wafer to form a second ion-implanted amorphous layer continuously to the first ion-implanted layer on a surface side of the wafer at a second depth from the surface of the wafer wherein the second depth is shallower than the first depth; and subjecting the wafer to a high temperature heat treatment in an atmosphere containing oxygen wherein the wafer is maintained at a temperature not lower than 1300° C. but lower than the melting point of silicon for 6 to 36 hours to change the first and second ion-implanted layers into a BOX layer, wherein a first dose amount in the step of forming the first ion-implanted layer is set to $2\times10^{17}$ to $3\times10^{17}$ atoms/$cm^2$, the first implantation energy is set to 165 to 240 keV, and a second dose amount in the step of forming the second ion-implanted layer is set to $1\times10^{14}$ to $1\times10^{16}$ atoms/$cm^2$.

The configuration is characterized in that wherein a first dose amount in the step of forming the first ion-implanted layer is set to $2\times10^{17}$ to $3\times10^{17}$ atoms/$cm^2$, the first implantation energy is set to 165 to 240 keV, and a second dose amount in the step of forming the second ion-implanted layer is set to $1\times10^{14}$ to $1\times10^{16}$ atoms/$cm^2$.

In the method for manufacturing the SIMOX wafer according to this claim 1, when the first dose amount in the step of forming the first ion-implanted layer is set to $2\times10^{17}$ to $3\times10^{17}$ atoms/$cm^2$, the first implantation energy is set to 165 to 240 keV, so that the first ion-implanted layer is formed at a position comparatively deep from the surface of the wafer. For this reason, in the high temperature heat treatment step, a first BOX layer transformed from the first ion-implanted layer is formed prior to a second BOX layer to which oxygen in the atmosphere containing oxygen contributes is formed, and thus variation in the depth direction of the BOX layer is decreased. As a result of this, the roughness Rms of the measurement area of 10 square micrometers in the interface between the SOI layer and the BOX layer and the roughness Rms of the measurement area of 10 square micrometers in the surface of the SOI layer can be reduced.

The invention of claim 1 further comprises wherein an oxygen ion implantation in the step of forming the first ion-implanted layer is performed with a plurality of steps in the descending order from the highest energy implantation to the lowest energy implantation, and an average of the first implantation energy in the plurality of steps is in the range of 165 to 240 keV.

In the method of this claim 1, the oxygen ion implantation in the step of forming the first ion-implanted layer 12 is performed with a plurality of steps. That allows a much probability that oxygen precipitates are dissolved and precipitated within an ion implantation region and a little probability that silicon will be left, which makes it possible to reduce the generation of a silicon island.

The invention according to claim 2 is related to claim 1, wherein the second implantation energy in the step of forming the second ion-implanted layer is lower than the first implantation energy in the step of forming the first ion-implanted layer, and a value obtained by deducting the second implantation energy from the first implantation energy is 10 to 30 keV.

In the method of this claim 2, the second implantation energy in the step of forming the second ion-implanted layer is set to be lower than the first implantation energy in the step of forming the first ion-implanted layer. Thanks to the aforesaid value of 10 to 30 keV, width of an area having the BOX layer formed therein is increased, and thus oxygen precipitate density is decreased, which makes it possible to reduce the generation of the silicon island within the BOX layer.

As described above, according to the method for manufacturing the present invention, when the first dose amount in the process of forming the first ion-implanted layer is set to $2\times10^{17}$ to $3\times10^{17}$ atoms/cm$^2$, the first implantation energy is set to 165 to 240 keV and the second dose amount in the step of forming the second ion-implanted layer 13 is set to $1\times10^{14}$ to $1\times10^{16}$ atoms/cm$^2$, so that the roughness Rms of the measurement area of 10 square micrometers in the surface of the SOI layer and the roughness Rms of the measurement area of 10 square micrometers in the interface between the SOI layer and the BOX layer of the wafer can be reduced, respectively.

DETAILED DESCRIPTION OF THE PREFERRED EMBODIMENTS

Figure 1:
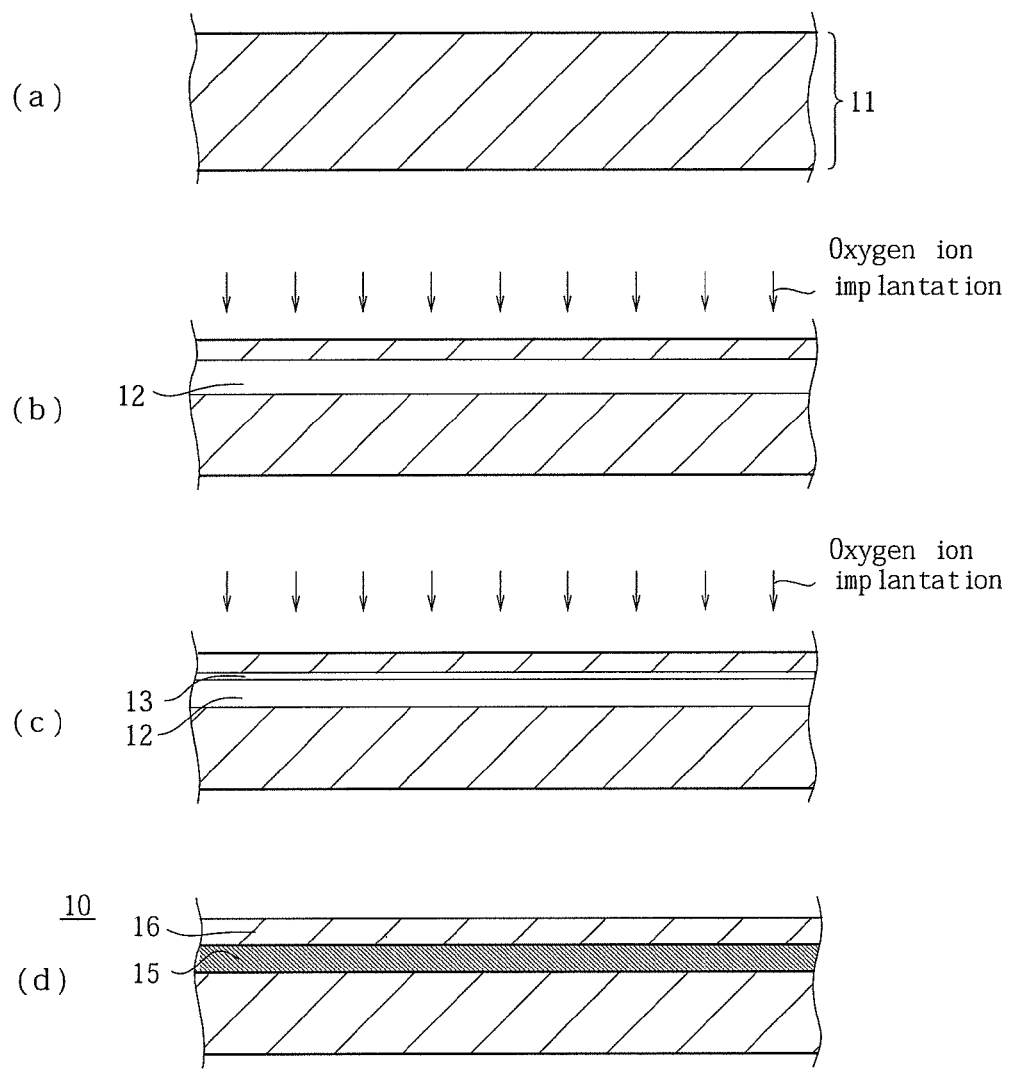
FIG. 1 is a diagram illustrating a method for manufacturing a SIMOX wafer sequentially according to an embodiment of the present invention.

Next, the best mode for carrying out the present invention will be described based on the drawings. As shown in FIG. 1(a) through FIG. 1(d), a method for manufacturing a SIMOX wafer of the present invention includes a process of implanting first oxygen ions from a surface of a silicon wafer 11 to form a first ion-implanted layer 12 containing highly concentrated oxygen within a wafer 11, a process of implanting second oxygen ions from the surface of the wafer 11 to form a second ion-implanted amorphous layer 13 continuously to the first ion-implanted layer 12 on a surface side of the wafer 11, and a process of subjecting the wafer 11 to a high temperature heat treatment in an atmosphere containing oxygen to change the first and second ion-implanted layers 12 and 13 into a BOX layer 15.

Hereinafter, the method for manufacturing the SIMOX wafer of the present invention will be described for each process.

<Process of Forming First Ion-Implanted Layer>

According to the process of forming the first ion-implanted layer, as shown in FIG. 1(a) and FIG. 1(b), first, oxygen ions are implanted from the surface of the silicon wafer 11 to form the first ion-implanted layer 12 containing highly concentrated oxygen within the wafer 11. Preferably, the silicon wafer 11 shown in FIG. 1(a) is manufactured by the Czochralski method.

The first ion-implanted layer 12 is formed by a single implantation step in such a way that, in a state where the silicon wafer 11 is accommodated in an ion implanter (not shown), and the temperature inside the apparatus is heated at 200 to 600° C., preferably at 300 to 500° C., oxygen ions of a first dose amount are implanted by irradiating a beam from the surface of the wafer 11 so as to have a peak at a first depth from the surface of the wafer 11. The atmosphere within the above-mentioned apparatus is in a vacuum state. By heating it to 200 to 600° C., ions can be implanted while keeping the surface of the wafer 11 in a state of a single crystal silicon, and the first ion-implanted layer 12 containing highly concentrated oxygen is formed while a damage due to the ion implantation is recovered. If the temperature is less than 200° C., the damage remains in the surface of the wafer 11 because of the damage due to the ion implantation not being recovered, whereas if the temperature exceeds 600° C., there may occur a problem that the degree of vacuum within the apparatus drops because of the large amount of outgassing.

The first dose amount of the above-mentioned oxygen ions is $2\times10^{17}$ to $3\times10^{17}$ atoms/cm$^2$, preferably $2.3\times10^{17}$ to $2.7\times10^{17}$ atoms/cm$^2$. The reason why the first dose amount is limited to $2\times10^{17}$ to $3\times10^{17}$ atoms/cm$^2$ is that if it is less than $2\times10^{17}$ atoms/cm$^2$, there may occur a problem that roughness thereof is increased, whereas if it exceeds $3\times10^{17}$ atoms/cm$^2$, there may occur a problem that a dielectric breakdown characteristic of the BOX layer 15 is deteriorated.

In addition, the first ion-implanted layer 12 having a peak of the ion implantation at the first depth of 400 to 600 nm, preferably 450 to 550 nm from the surface of the wafer 11 is formed in parallel to the surface of the wafer 11. In order to achieve this, the first implantation energy is set to 165 to 240 keV, preferably to 175 to 220 keV. The reason why the first implantation energy is set to 165 to 240 keV is that if it is less than 165 keV, roughness Rms of the measurement area of 10 square micrometers in an interface between the SOI layer 16 and the BOX layer 15 and that in a surface of the SOI layer 16 will increase, whereas if it exceeds 240 keV, the following two problems may occur. It is firstly because a special ion implanter is required, and secondly because oxygen ions enter so deeply from the surface of the wafer 11 that the high-temperature oxidizing treatment for an extremely long-time is required in order to form the SOI layer 16 with a desired film thickness.

Figure 3:
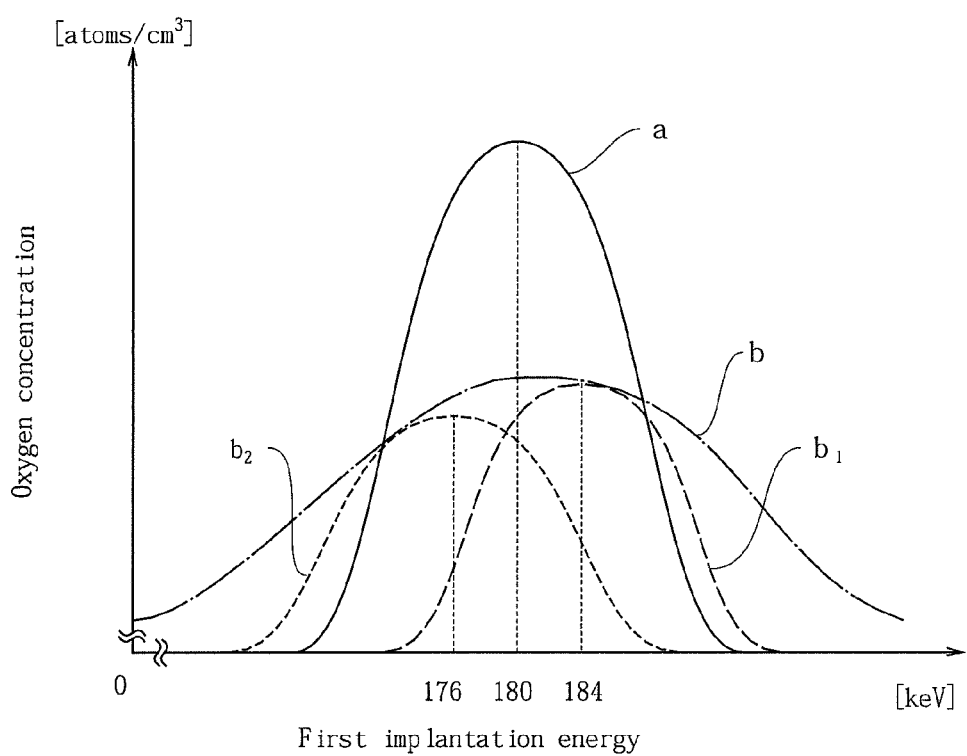
FIG. 3 is a diagram illustrating a relation between a single implantation step and double implantation steps of a first ion-implanted layer, and an oxygen concentration within the first ion-implanted layer of the present invention.

Furthermore, as shown in FIG. 3, in the case of the first ion-implanted layer 12 due to this single implantation step, the width of the peak thereof is narrow, oxygen precipitate density in which oxygen precipitates during the subsequent high temperature heat treatment is high, it has a broad base, and the oxygen precipitate density in which the oxygen precipitates during the subsequent high temperature heat treatment is low (ion implantation a). Due to variation of the oxygen precipitate density, the oxygen precipitates are dissolved and precipitated within the first ion-implanted layer 12. If the oxygen precipitate density is high, silicon is left. As a result, the inside of the ion implantation region is dotted with silicon, so that there is a problem that many silicon islands are generated in the first BOX layer 15a. For this reason, in this process of forming the first ion-implanted layer, an oxygen ion implantation is performed not with a single implantation step but with a plurality of implantation steps, preferably may be separately performed with two implantation steps. In this case, an average of the first implantation energy will be set to 165 to 240 keV. Preferably, the implantation may be performed in the descending order from the highest energy to the lowest energy implantation. The reason is that since the damage in the later stage of the implantation remains, there is obtained an effect similar to that a value of the second implantation energy, described hereinafter, is set to be relatively smaller than a value of the first implantation energy.

Specifically, the first ion-implanted layer 12 shall be formed with double implantation steps, the implantation energy in the first step be 184 keV (ion implantation $b_1$), the implantation energy in the second step be 176 keV (ion implantation $b_2$), and oxygen ions of the first dose amount for every stage are implanted by irradiating the beam from the surface of the wafer 11.

The above-mentioned first dose amount of oxygen ions of the first step is $1.0 \times 10^{17}$ to $1.5 \times 10^{17}$ atoms/cm$^2$, preferably $1.15 \times 10^{17}$ to $1.35 \times 10^{17}$ atoms/cm$^2$. The above-mentioned first dose amount of oxygen ions of the second step is $1.0 \times 10^{17}$ to $1.5 \times 10^{17}$ atoms/cm$^2$, preferably $1.15 \times 10^{17}$ to $1.35 \times 10^{17}$ atoms/cm$^2$. The first dose amount obtained by adding the ion implantation $b_1$ and the ion implantation $b_2$ is equal to the first dose amount of ion implantation a. The ion implantation $b_1$ and the ion implantation $b_2$ of these two implantation steps are fused, so that the first ion-implanted layer 12 is formed, having a peak at the first depth i.e. at the same depth as that of a case where the ion implantation is performed with the implantation energy of 180 keV, the average of 184 keV and 176 keV (ion implantation b).

In the case of the first ion-implanted layer 12 due to these two implantation steps, the width of the peak therein is wider than that of the ion implantation a, and the oxygen precipitate density is low. For this reason, silicon is hard to be left within the first ion-implanted layer 12, which makes it possible to reduce generation of silicon islands.

Further, when the oxygen ion implantation in the process of forming the first ion-implanted layer is performed with a plurality of steps, a value obtained by deducting the energy of the second step from the energy of the first step is set at 12 keV or lower, preferably at 8 keV or lower. The energy of the first step is set to be larger than the energy of the later step, which can increase film thickness of the BOX layer 15, and improve the dielectric breakdown characteristic of the BOX layer 15.

Additionally, after the ion implantation is performed with a single step or multiple steps and the process of forming the first ion-implanted layer is completed, the wafer 11 having the first ion-implanted layer 12 formed therein is cooled down to a temperature in the range of a room temperature to 200° C., i.e. a temperature lower than the heating temperature. Subsequently, the wafer is taken out from the cooled apparatus, and after cleaned and dried, it is accommodated into the apparatus again to be subjected to the following process of forming the second ion-implanted layer.

<Process of Forming Second Ion-Implanted Layer>

In the process of forming the second ion-implanted layer, as shown in FIG. 1(c), the second oxygen ions are implanted from the surface of the wafer 11 to form the second ion-implanted amorphous layer 13 continuously to the first ion-implanted layer 12 containing highly concentrated oxygen on the surface side of the wafer 11. The second ion-implanted layer 13 overlaps with an upper portion of the first ion-implanted layer 12, resulting in an amorphous layer containing highly concentrated oxygen therewithin.

The second ion-implanted layer 13 is formed by implanting oxygen ions through irradiating a beam from the surface of the wafer 11 so as to have a peak at a second depth from the surface of the wafer 11, the second depth being shallower than the first depth. The above-mentioned atmosphere within the apparatus is in a vacuum state.

The above-mentioned second dose amount of oxygen ions is $1 \times 10^{14}$ to $1 \times 10^{16}$ atoms/cm$^2$, preferably $1 \times 10^{15}$ to $1 \times 10^{16}$ atoms/cm$^2$. The reason why the second dose amount is limited to $1 \times 10^{14}$ to $1 \times 10^{16}$ atoms/cm$^2$ is that if it is less than $1 \times 10^{14}$ atoms/cm$^2$, there may occur a problem that the second ion-implanted layer 13 in an amorphous state is not formed, whereas if it exceeds $1 \times 10^{16}$ atoms/cm$^2$, there may occur a problem that a temperature of the wafer 11 rises too high due to a long irradiation time of the beam.

In addition, the second ion-implanted layer 13 of amorphous having a peak of the ion implantation in the second depth targeting at 250 to 500 nm, preferably at 300 to 400 nm from the surface of the wafer 11 is formed continuously to the plane on a wafer surface side of the first ion-implanted layer 12 having the peak of the ion implantation at the first depth in parallel to the surface of the wafer 11. In order to achieve this, the second implantation energy is set to 135 to 230 keV lower than the first implantation energy, preferably to 145 to 220 keV.

Note herein that, in this process of forming the second ion-implanted layer, an oxygen ion implantation is performed not with a single implantation step but with a plurality of implantation steps, preferably may be separately performed with two implantation steps. In this case, an average of the second implantation energy will be set to 135 to 230 keV. Preferably, the implantation may be performed in the ascending order from the lowest energy implantation to the highest energy implantation. The reason is that implanting ions in the ascending order can increase film thickness of the BOX layer 15, and improve the dielectric breakdown characteristic of the BOX layer 15. By making the value of the second implantation energy relatively smaller than the value of the first implantation energy, which is, however, within the range of values not less than a certain fixed value, the value obtained by deducting the second implantation energy from the first implantation energy is increased, and a distance between the peaks of the first ion-implanted layer 12 and the second ion-implanted layer 13 is increased. For this reason, variation in the depth direction of the BOX layer forming area is increased, so that there may occur a problem that the roughness Rms of the measurement area of 10 square micrometers in the surface of the SOI layer 16 and the roughness Rms of the measurement area of 10 square micrometers in the interface between the SOI layer 16 and the BOX layer 15 of the wafer are increased. Similarly, if the value obtained by deducting the second implantation energy from the first implantation energy is increased, a width of the BOX layer forming area is also increased. For this reason, the oxygen precipitate densities within the first and second ion-implanted layers 12 and 13 are decreased, which makes it possible to reduce generation of silicon islands within the BOX layer 15. Based on two reasons described above, in order to reduce the roughness and the generation of the silicon islands within the BOX layer 15, the value obtained by deducting the second implantation energy from the first implantation energy is set to 10 to 30 keV, preferably 10 to 20 keV.

As described above, the second implantation energy is set to be lower than the first implantation energy in the process of forming the first ion-implanted layer 12, and the value obtained by deducting the second implantation energy from the first implantation energy is set to 10 to 30 keV, so that the roughness Rms of the measurement area of 10 square micrometers in the surface of the SOI layer 16 of SIMOX wafer 10 and the roughness Rms of the measurement area of 10 square micrometers in the interface between the SOI layer 16 and the BOX layer 15 of the wafer can be further reduced, respectively, which makes it possible to provide the SIMOX wafer 10 in which the dielectric breakdown characteristic of the BOX layer 15 is improved.

Incidentally, after completing the process of forming the second ion-implanted layer, the wafer 11 in which the first and second ion-implanted layers 12 and 13 are formed is taken out from the apparatus, and after cleaned and dried, it is accommodated into an anneal furnace to be subjected to the following high temperature heat treatment process.

<High Temperature Heat Treatment Process>

As shown in FIG. 1(d), a high temperature heat treatment process is a process for subjecting the wafer 11 to a high temperature heat treatment in an atmosphere containing oxygen to transform the first and second ion-implanted layers 12 and 13 into the BOX layer 15. As shown in FIG. 2(c), the BOX layer 15 to be formed is composed of the first BOX layer 15a formed by transformation of the first ion-implanted layer 12 containing highly concentrated oxygen, and a second BOX layer 15b which is formed in an upper portion of this first BOX layer 15a and formed by transformation of the second ion-implanted layer 13 resulting from a contribution of oxygen in the atmosphere containing oxygen of the heat treatment to the second ion-implanted amorphous layer 13.

The first BOX layer 15a and the second BOX layer 15b due to the high temperature heat treatment is formed by the high temperature treatment in such a way that the wafer 11 having the first and second ion-implanted layers 12 and 13 formed therein is accommodated into the anneal furnace (not shown), a temperature inside this furnace is raised to a temperature in the range of 1300° C. to less than a silicon melting point, preferably 1320 to 1350° C., the wafer 11 is held for 6 to 36 hours, preferably for 12 to 24 hours while keeping this temperature, and is then cooled down to a room temperature.

The reason why the above-mentioned furnace temperature is limited to a temperature in the range of 1300° C. to less than the silicon melting point is that dissolving and growing of the oxygen precipitates are insufficient at a temperature less than 1300° C. and a high-quality BOX layer 15 cannot be formed. The reason why the above-mentioned holding time is limited to 6 to 36 hours is that if it is less than 6 hours, dissolving and growing of the oxygen precipitates are insufficient, and thus a high-quality BOX layer 15 cannot be formed, whereas if it exceeds 36 hours, the manufacturing efficiency is decreased, and the productivity is decreased. The above-mentioned atmosphere in the furnace during the temperature rise is a mixed atmosphere of inert gas, such as argon, nitrogen ($N_2$) containing oxygen of 0.5 to 5.0 volume %, preferably 0.5 to 1.0 volume %. The above-mentioned atmosphere in the furnace after the temperature rise is an atmosphere containing oxygen of an oxygen gas of 5 to 100 volume %, preferably 10 to 50 volume %, containing inert gas, such as argon or nitrogen.

Specifically, as shown in FIG. 2(a), firstly, when the temperature rise begins, the oxygen precipitate ($SiO_2$) grows from a lower part of the first ion-implanted layer 12 containing highly concentrated oxygen, and begins to transform into the first BOX layer 15a. Meanwhile, since the second ion-implanted amorphous layer 13 contains highly concentrated oxygen therewithin, re-crystallization does not proceed smoothly, and it begins to change into a high-density defect layer 14 containing a poly-silicon, a twin, or an oxidation-induced stacking fault. An area in which this high-density defect layer 14 is formed has a property that oxygen precipitates easily. Next, as shown in FIG. 2(b), during holding it at the constant temperature after the temperature rising, oxygen in the atmosphere containing oxygen enters the wafer 11 from the front and rear sides of the wafer 11 to be diffused within the wafer 11, and gathers in the high-density defect layer 14 to precipitate as $SiO_2$. As described above, the high-density defect layer 14 changes into the second BOX layer 15b continuously to the first BOX layer 15a. Thus, as shown in FIG. 2(c), the first BOX layer 15a and the second BOX layer 15b are formed.

The growth of the BOX layer 15 is that small oxygen precipitates gather in greater oxygen precipitates, are absorbed therein, and then disappear, and this is called Ostwald growth.

When the first implantation energy in the process of forming the first ion-implanted layer is a low value of less than 165 keV, the first ion-implanted layer 12 and the second ion-implanted layer 13 are formed in a position shallow from the surface of the wafer 11. For this reason, it is considered that a ratio for oxygen in the atmosphere containing oxygen to contribute to formation of the oxygen precipitate composing the BOX layer 15 is increased, and the second BOX layer 15b and the first BOX layer 15a are opposed to each other to thereby increase the variation in the depth direction of the BOX layer forming area, so that the roughness Rms is increased. It is considered that the roughness Rms generated in this interface between the SOI layer 16 and the BOX layer 15 affects the surface of the SOI layer 16, and the roughness of the surface of the SOI layer 16 is also increased.

On the contrary, when the first implantation energy in the process of forming the first ion-implanted layer is a high value of 165 keV or more, the first ion-implanted layer 12 and the second ion-implanted layer 13 are formed in the first depth comparatively deep from the surface of the wafer 11.

For this reason, as shown in FIG. 2(a), in an early stage of holding it at the constant temperature during temperature rise and after temperature rise, the first BOX layer 15a is formed previously, so that a ratio for the second BOX layer 15b to contribute to the formation of the oxygen precipitate composing the BOX layer 15 is decreased. As a result of this, it is considered that since the second BOX layer 15b and the first BOX layer 15a are not opposed to each other, and variation in the depth direction of the BOX layer 15 is decreased, the roughness Rms is decreased.

Based on the above-mentioned reason, the first implantation energy is set to a high energy of 165 to 240 keV, and the second implantation energy is set to the energy lower than the first implantation energy. As described above, the SIMOX wafer obtained by the manufacturing method according to the present invention can reduce the roughness Rms of the measurement area of 10 square micrometers in the surface of the SOI layer 16 and the roughness Rms of the measurement area of 10 square micrometers in the interface between the SOI layer 16 and the BOX layer 15 of the wafer, respectively. Particles on the surface of the wafer 10 can be measured by reducing the roughness Rms. In addition, the SIMOX wafer 10 that realizes improvement of the dielectric breakdown characteristic of the BOX layer 15 can be obtained.

EXAMPLES

Next, an example of the present invention will be described in detail with a comparative example.

Examples 1-1 through 1-6, Comparative examples 1-1 and 1-2

Figure 2:
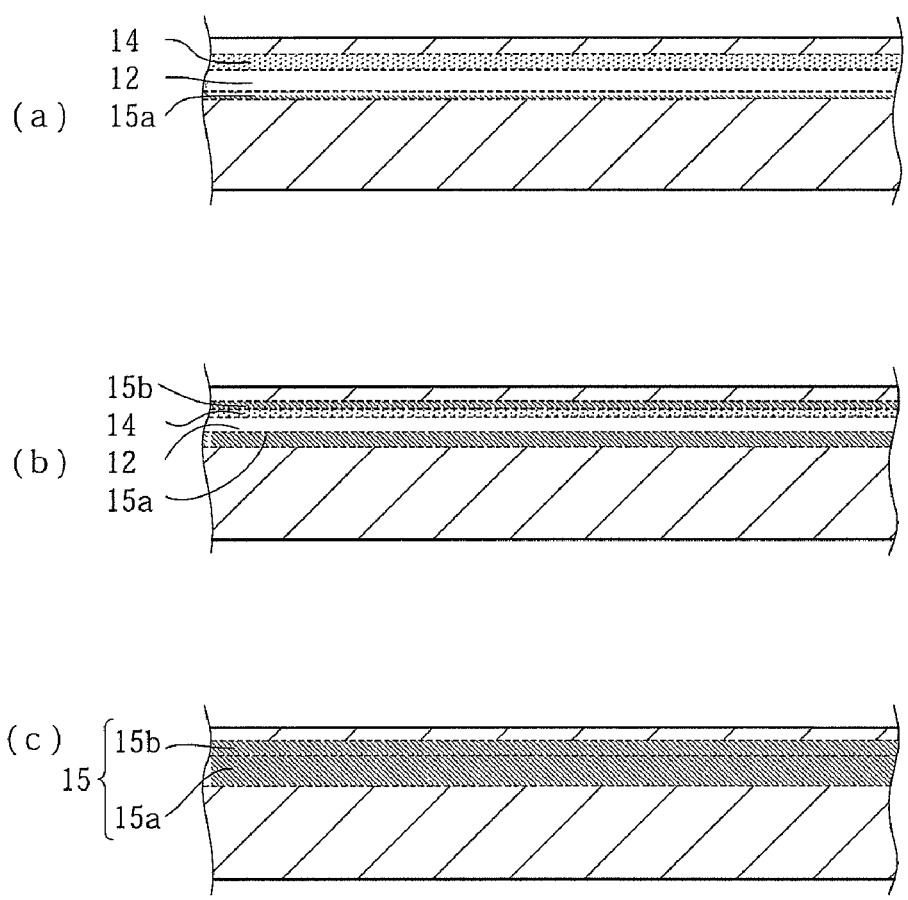
FIG. 2 is a diagram illustrating changes within the wafer subjected to a high temperature heat treatment according to the present invention.

As shown in FIG. 1, there was prepared a silicon wafer 11 which is a P-type silicon wafer of which diameter is 300 mm, crystal orientation is <100>, and resistivity is 10 to 20 ohm-cm. Firstly, after accommodating the wafer 11 in the ion implanter, the inside of the apparatus was made a vacuum state and the temperature inside the apparatus was heated to 400° C.

Next, ion implantation of oxygen ions ($O^+$) was performed in a first dose amount of $2.5 \times 10^{17}$ atoms/$cm^2$ with a first implantation energy from the surface of the wafer 11, and a first ion-implanted layer 12 having a peak at the first depth of 0.4 to 0.5 micrometers from the surface of the wafer 11 was formed. Thereafter, the temperature inside the apparatus was cooled down to a room temperature.

Next, the wafer 11 was taken out from the apparatus to be cleaned. After drying the cleaned wafer 11, it was accommodated into the apparatus again. Subsequently, ion implantation of oxygen ions ($O^+$) was performed in a second dose amount of $6 \times 10^{15}$ atoms/$cm^2$ with a second implantation energy 10 keV lower than the value of the first implantation energy from the surface of the wafer 11, and a second ion-implanted layer 13 having a peak at the second depth of 0.3 to 0.4 micrometers from the surface of the wafer 11 was formed in such a manner as to partially overlap with the first ion-implanted layer 12 on the surface side of the wafer 11. Thereafter, the temperature inside the apparatus was cooled down to a room temperature.

Further, the wafer 11 was taken out from the inside of the apparatus to be cleaned. After drying each cleaned wafer 11, it was accommodated into a vertical furnace. Subsequently, the temperature inside the furnace was raised to 1300° C. In addition, the atmosphere inside the furnace was controlled by a mass flow controller so that oxygen might be 50 volume % and argon 50 volume % therein to form an atmosphere containing oxygen.

The wafer 11 was held for 8 hours while keeping the temperature inside the furnace at 1300° C. under this atmosphere containing oxygen. Thereby, a SIMOX wafer 10 having the BOX layer 15 therein was obtained.

The above-mentioned values of the first implantation energy were set to 160 keV, 164 keV, 168 keV, 172 keV, 176 keV, 180 keV, 184 keV, and 188 keV, respectively, and the SIMOX wafers 10 obtained with the above-mentioned methods are referred to as Examples 1-1 through 1-6, and Comparative examples 1-1 and 1-2, respectively.

Examples 2-1 through 2-4

There was obtained a SIMOX wafer 10 in a manner similar to that of Examples 1-1 through 1-6 and Comparative examples 1-1 and 1-2 except that ion implantation was changed from a single implantation step to double implantation steps in the process of forming the first ion-implanted layer, oxygen ions ($O^+$) in the first step was set to $1.25 \times 10^{17}$ atoms/$cm^2$ and oxygen ions ($O^+$) in the second step was set to $1.25 \times 10^{17}$ atoms/$cm^2$, the averages of first implantation energy of the first step and the second step were set to 172 keV, 176 keV, 180 keV, and 184 keV, respectively, and the value obtained by deducting the first implantation energy of the second step from the first implantation energy of the first step was set to 8 keV. The SIMOX wafers 10 obtained by the above-mentioned methods are referred to as Examples 2-1 through 2-4, respectively.

Examples 3-1 and 3-2

There was obtained a SIMOX wafer 10 in a manner similar to that of Examples 1-1 through 1-6 and Comparative examples 1-1 and 1-2 except that the first implantation energy was set to 205 keV and oxygen ions ($O^+$) of the first dose amount was set to $2.5 \times 10^{17}$ atoms/$cm^2$ in the process of forming the first ion-implanted layer, and the second implantation energy was set to the values provided by respectively deducting 15 keV and 20 keV from the above-mentioned first implantation energy of 205 keV and oxygen ions ($O^+$) of the second dose amount was set to $6 \times 10^{15}$ atoms/$cm^2$ in the process of forming the second ion-implanted layer. The SIMOX wafers 10 obtained with the above-mentioned methods are referred to as Examples 3-1 and 3-2, respectively.

Comparative Testing and Evaluation

Figure 4:
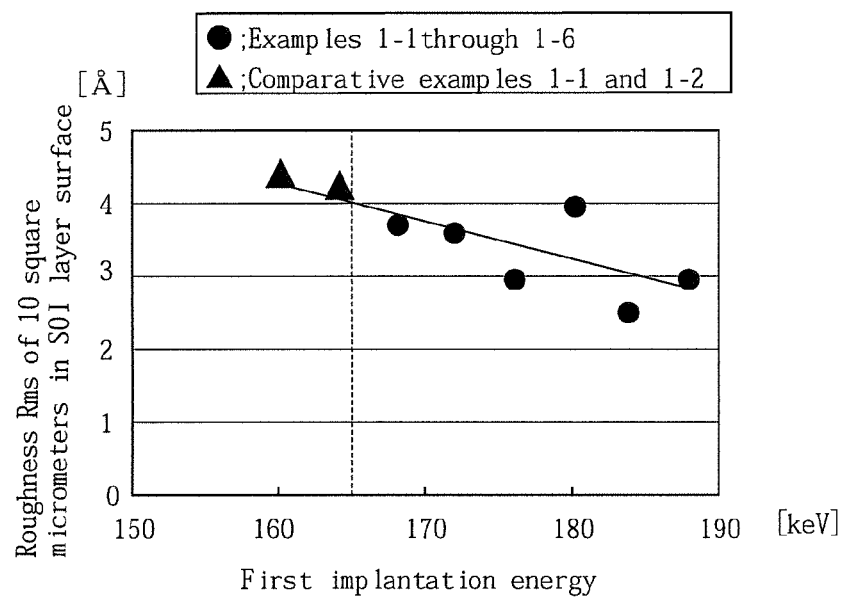
FIG. 4(a) is a diagram illustrating a relation between a first implantation energy with the single implantation step in a process of forming the first ion-implanted layer and roughness Rms of a measurement area of 10 square micrometers in a surface of the SOI layer.
FIG. 4(b) is a diagram illustrating a relation between the first implantation energy with the single implantation step in the process of forming the first ion-implanted layer and the roughness Rms of a measurement area of 10 square micrometers in an interface between the SOI layer and a BOX layer.
Figure 4:
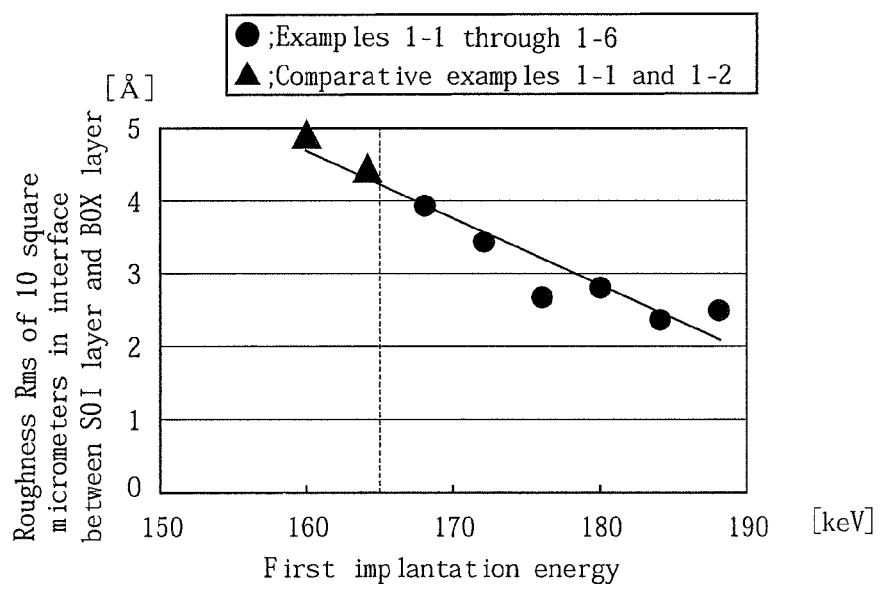
Figure 5:
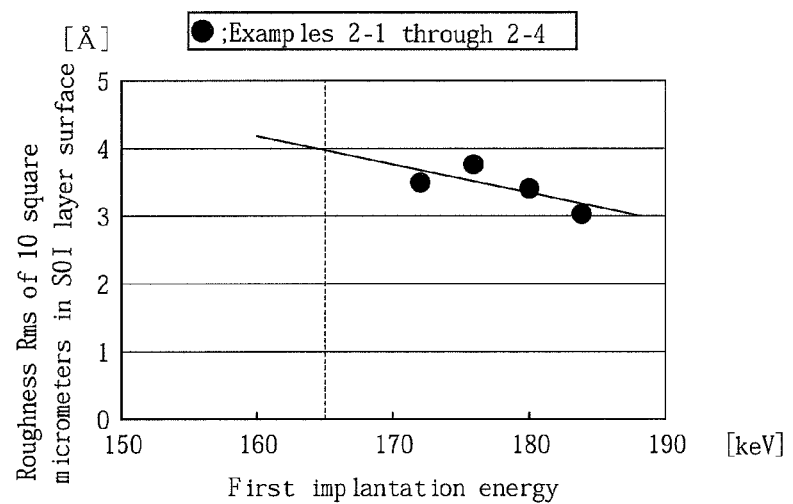
FIG. 5(a) is a diagram illustrating a relation between the first implantation energy with double implantation in the process of forming the first ion-implanted layer and the roughness Rms of a measurement area of 10 square micrometers in the surface of the SOI layer.
FIG. 5(b) is a diagram illustrating a relation between the first implantation energy with double implantation in the process of forming the first ion-implanted layer and the roughness Rms of a measurement area of 10 square micrometers in the interface between the SOI layer and the BOX layer.
Figure 5:
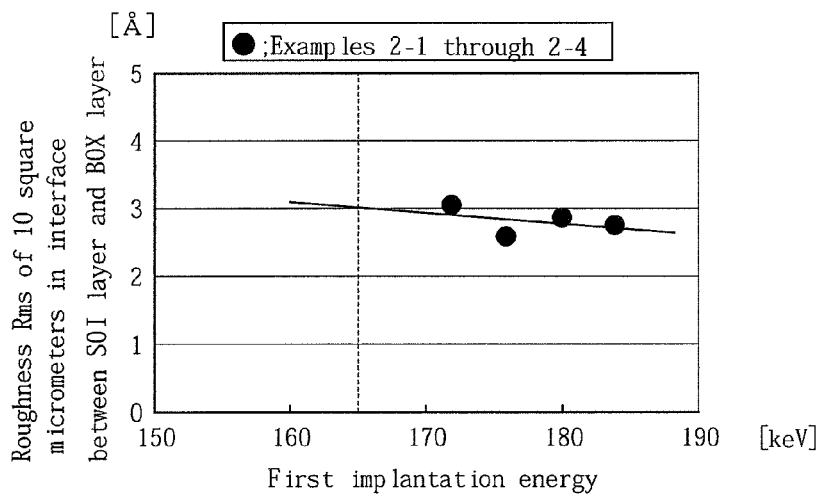
Figure 6:
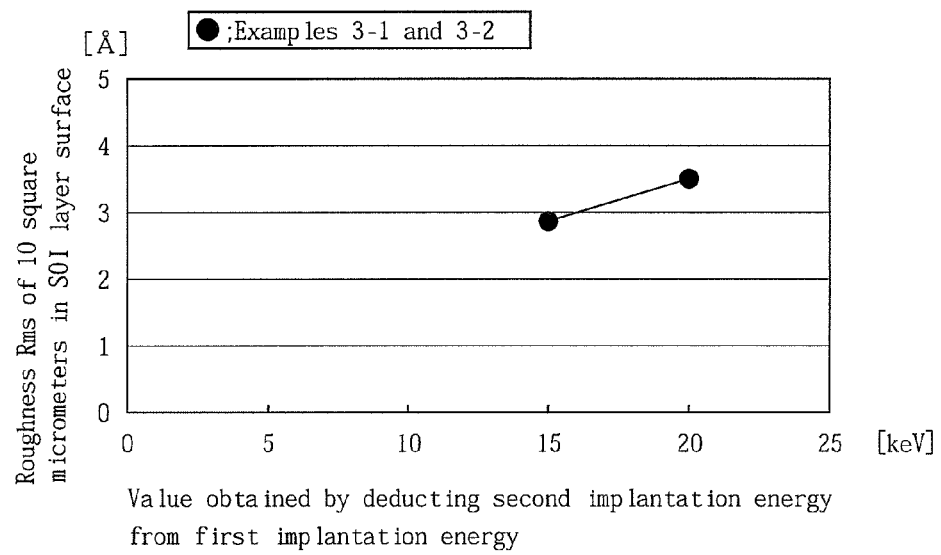
FIG. 6(a) is a diagram illustrating a relation between a value obtained by deducting the second implantation energy from the first implantation energy and the roughness Rms of a measurement area of 10 square micrometers in the surface of the SOI layer.
FIG. 6(b) is a diagram illustrating a relation between the value obtained by deducting the second implantation energy from the first implantation energy and the roughness Rms of a measurement area of 10 square micrometers in the interface between the SOI layer and the BOX layer.
Figure 6:
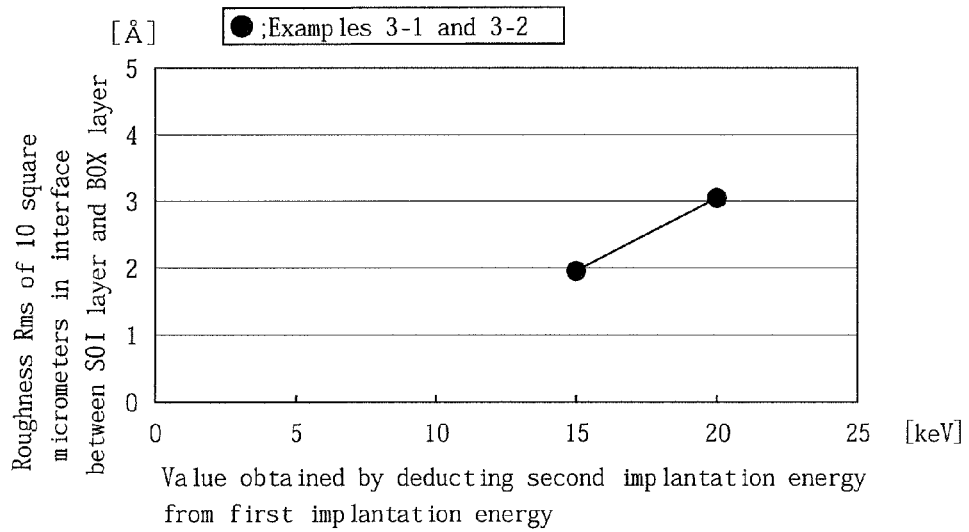

The roughness Rms of the measurement area of 10 square micrometers in the surface of the SOI layer of the SIMOX wafer of each of Examples 1-1 through 3-2, and Comparative examples 1-1 and 1-2 was measured with an AFM (Atomic Force Microscope). In addition, the dielectric breakdown characteristic of the BOX layer was evaluated using a dielectric breakdown tester. Further, the SOI layer of the SIMOX wafer was etched by potassium hydroxide (KOH), and then the roughness Rms of the measurement area of 10 square micrometers in the interface between the SOI layer and the BOX layer was measured with the AFM. These results are shown in FIG. 4 through FIG. 7. FIG. 4 shows the Examples 1-1 through 1-6, and Comparative examples 1-1 and 1-2; FIG. 5, Examples 2-1 through 2-4; and FIG. 6 and FIG. 7, Examples 3-1 and 3-2.

As is clear from an approximate line of Examples 1-1 through 1-6, and Comparative examples 1-1 and 1-2 shown in FIG. 4(a), when the first implantation energy was 165 keV or more, the roughness Rms of the measurement area of 10 square micrometers in the surface of the SOI layer indicated the value of 4 angstroms or less. As is clear from an approximate line of Examples 1-1 through 1-6, and the Comparative examples 1-1 and 1-2 shown in FIG. 4(b), when the first implantation energy was 165 keV or more, the roughness Rms of the measurement area of 10 square micrometers in the interface between the SOI layer and the BOX layer indicated the value of 4 angstroms or less. As a result, when the first implantation energy is less than 165 keV, the roughness Rms of the measurement area of 10 square micrometers will exceed 4 angstroms, and thus it turned out that the first implantation energy may be set to 165 keV or more.

As is clear from an approximate line of Examples 2-1 through 2-4 shown in FIG. 5(a), when the average of the first and second implantations of the first implantation energy was 165 keV or more, the roughness Rms of the measurement area of 10 square micrometers in the surface of the SOI layer indicated the value of 4 angstroms or less. As is clear from an approximate line of Examples 2-1 through 2-4 shown in FIG. 5(b), when the average of the first and second implantations of the first implantation energy was 165 keV or more, the roughness Rms of the measurement area of 10 square micrometers in the interface between the SOI layer and the BOX layer indicated the value of 3 angstroms or less. As a result, the average of the first and second implantations of the first implantation energy is less than 165 keV, the surface of the SOI layer roughness Rms of measurement area of 10 square micrometers will exceed 4 angstroms, and thus it turned out that the average of the first and second implantations of the first implantation energy may be 165 keV or more.

From the result of Examples 3-1 and 3-2 shown in FIG. 6(a), when the first implantation energy was 205 keV, the roughness Rms of the measurement area of 10 square micrometers in the surface of the SOI layer indicated the value of 2.8 angstroms when the value obtained by deducting the second implantation energy from the first implantation energy was 15 keV. Meanwhile, when it was 20 keV, the value indicated 3.5 angstroms. From the result of Examples 3-1 and 3-2 shown in FIG. 6(b), when the first implantation energy was 205 keV, the roughness Rms of the measurement area of 10 square micrometers in the interface between the SOI layer and the BOX layer shows the value of 2 angstroms when the value obtained by deducting the second implantation energy from the first implantation energy was 15 keV. Meanwhile, when it was 20 keV, the value indicated 3 angstroms.

Figure 7:
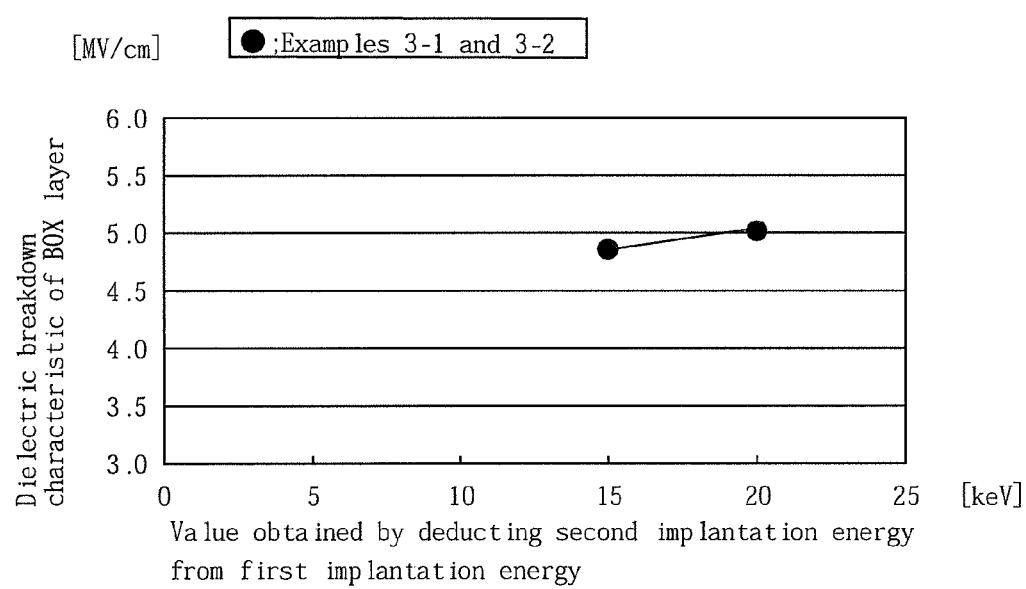
FIG. 7 is a diagram illustrating a relation between the value obtained by deducting the second implantation energy from the first implantation energy and a dependent dielectric breakdown characteristic of the BOX layer.

From the result of Examples 3-1 and 3-2 shown in FIG. 7, there was observed a tendency that the larger the value obtained by deducting the second implantation energy from the first implantation energy was, the further the dielectric breakdown characteristic of the BOX layer was improved.

From the result of the above-mentioned examples 1-1 through 3-2, and Comparative examples 1-1 and 1-2, it turned out that when the first dose amount in the process of forming the first ion-implanted layer is set to $2\times10^{17}$ to $3\times10^{17}$ atoms/cm$^2$, by setting the first implantation energy to 165 to 240 keV and the second dose amount in the process of forming the second ion-implanted layer to $1\times10^{14}$ to $1\times10^{16}$ atoms/cm$^2$, the roughness Rms of the measurement area of 10 square micrometers in the surface of the SOI layer and the roughness Rms of the measurement area of 10 square micrometers in the interface between the SOI layer and the BOX layer can be reduced to 4 angstroms or less, respectively, and the SIMOX wafer 10 that realizes improvement of the dielectric breakdown characteristic of the BOX layer 15 can be obtained.

Particularly, by setting the value of the second implantation energy in the process of forming the second ion-implanted layer lower than that of the first implantation energy in the process of forming the first ion-implanted layer, and setting the value obtained by deducting the second implantation energy from the first implantation energy to a desired range, there was observed a tendency that the dielectric breakdown characteristic of the BOX layer was improved.

What is claimed is:

1. A method for manufacturing a SIMOX wafer comprising the following steps in sequence:
    heating a silicon wafer to a temperature in the range from 200 to 600° C. and implanting oxygen ions in a first dose amount with a first implantation energy from a surface of the wafer to form a first ion-planted layer containing highly concentrated oxygen at a first depth from the surface of the wafer;
    cooling the wafer having the first ion-implanted layer formed therein to a temperature in the range from room temperature to 200° C. which is lower than the heating temperature and implanting oxygen ions in a second dose amount with a second implantation energy from the surface of the wafer to form a second ion-implanted amorphous layer continuous with the first ion-implanted layer on a surface side of the wafer at a second depth from the surface of the wafer wherein the second depth is shallower than the first depth; and
    subjecting the wafer to a high temperature heat treatment in an atmosphere containing oxygen wherein the wafer is maintained at a temperature not lower than 1300° C. but lower than the melting point of silicon for 6 to 36 hours to change the first and second ion-implanted layers into a BOX layer,
    wherein the first dose amount in the step of forming the first ion-implanted layer from $2\times10^{17}$ to $3\times10^{17}$ atoms/cm$^2$,
    wherein an oxygen ion implantation in the step of forming the first ion-implanted layer is performed in a plurality of steps in descending order from the highest energy implantation to the lowest energy implantation, and the average first implantation energy in the plurality of steps is in the range from 165 to 240 keV, and
    wherein the first implantation energy from 165 to 240 keV, and the second dose amount in the step of forming the second ion-implanted layer is from $1\times10^{14}$ to $1\times10^{16}$ atoms/cm$^2$.

2. The method of claim 1 wherein the second implantation energy in the step of forming the second ion-implanted layer is lower than the first implantation energy in the step of forming the first ion-implanted layer, and a value obtained by deducting the second implantation energy from the first implantation energy is in the range from 10 to 30 keV.

* * * * *